(12) United States Patent
Shang et al.

(10) Patent No.: US 12,349,474 B2
(45) Date of Patent: Jul. 1, 2025

(54) DETECTION BASE PLATE AND FLAT-PANEL DETECTOR

(71) Applicants: Beijing BOE Sensor Technology Co., Ltd., Beijing (CN); BOE Technology Group Co., Ltd., Beijing (CN)

(72) Inventors: Jianxing Shang, Beijing (CN); Xiangmi Zhan, Beijing (CN); Zhenwu Jiang, Beijing (CN); Huinan Xia, Beijing (CN); Xuecheng Hou, Beijing (CN)

(73) Assignees: BEIJING BOE SENSOR TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/432,458

(22) Filed: Feb. 5, 2024

(65) Prior Publication Data

US 2024/0178339 A1 May 30, 2024

Related U.S. Application Data

(63) Continuation of application No. 17/354,407, filed on Jun. 22, 2021, now Pat. No. 11,961,935.

(30) Foreign Application Priority Data

Oct. 22, 2020 (CN) .......................... 202011142827.8

(51) Int. Cl.
*H10F 30/29* (2025.01)
*H10F 71/00* (2025.01)
*H10F 77/20* (2025.01)

(52) U.S. Cl.
CPC ........... *H10F 30/29* (2025.01); *H10F 71/129* (2025.01); *H10F 77/206* (2025.01)

(58) Field of Classification Search
CPC .......... H01L 31/115; H01L 31/022408; H01L 31/1868; H01L 27/14658; H01L 27/14612;
(Continued)

(56) References Cited

U.S. PATENT DOCUMENTS

| 5,453,629 A | 9/1995 | Gofuku et al. |
| 2012/0241834 A1* | 9/2012 | Nakajima ......... H01L 21/76816 |
| | | 257/E27.06 |

(Continued)

FOREIGN PATENT DOCUMENTS

| CN | 105742386 B | 10/2017 |
| CN | 107331725 A | 11/2017 |

(Continued)

OTHER PUBLICATIONS

Notice of Allowance dated Nov. 29, 2023, issued in U.S. Appl. No. 17/354,407 (7 pages).

(Continued)

*Primary Examiner* — Sitaramarao S Yechuri
(74) *Attorney, Agent, or Firm* — WHDA, LLP

(57) ABSTRACT

A detection base plate and a flat-panel detector. The detection base plate comprises multiple detection pixel units arranged in an array. Each detection pixel unit comprises: a thin-film transistor, a sacrificial layer and a photoelectric conversion part that are disposed on a substrate, wherein the sacrificial layer is located between the thin-film transistor and the photoelectric conversion part; the thin-film transistor comprises an active layer, a first electrode and a second electrode; at least part of an orthographic projection of the active layer on the substrate is located within an orthographic projection of the sacrificial layer on the substrate; and the photoelectric conversion part is electrically connected to the sacrificial layer and the first electrode. In the (Continued)

detection base plate, the sacrificial layers of the detection pixel units are mutually independent.

18 Claims, 8 Drawing Sheets

(58) Field of Classification Search
CPC .... H01L 27/14605; Y02E 10/50; Y02P 70/50; G01T 1/241; G01T 1/242; H10F 30/29; H10F 71/129; H10F 77/206; H10F 39/189; H10F 39/8037; H10F 39/8023
See application file for complete search history.

(56) References Cited

U.S. PATENT DOCUMENTS

| | | | |
|---|---|---|---|
| 2014/0091203 | A1 | 4/2014 | Fujiyoshi et al. |
| 2019/0187305 | A1 | 6/2019 | Yi et al. |
| 2019/0296076 | A1* | 9/2019 | Misaki ............. H01L 27/14692 |
| 2021/0111218 | A1 | 4/2021 | Nakamura et al. |
| 2021/0391374 | A1* | 12/2021 | Moriwaki ......... H01L 29/78636 |
| 2022/0045019 | A1 | 2/2022 | Nakano et al. |

FOREIGN PATENT DOCUMENTS

| | | |
|---|---|---|
| CN | 110034135 A | 7/2019 |
| CN | 110854147 A | 2/2020 |
| CN | 111244119 A | 6/2020 |
| CN | 210956703 U | 7/2020 |
| KR | 20150015237 A | 2/2015 |

OTHER PUBLICATIONS

Non-Final Office Action dated Apr. 20, 2023, issued in U.S. Appl. No. 17/354,407 (12 pages).
Final Office Action dated Sep. 15, 2023, issued in U.S. Appl. No. 17/354,407 (11 pages).
Office Action dated Jan. 24, 2025, issued in counterpart CN Application No. 202011142827.8, with English translation. (21 pages).

* cited by examiner

DETECTION BASE PLATE AND FLAT-PANEL DETECTOR

CROSS REFERENCE TO RELEVANT APPLICATIONS

This is a continuation application of U.S. application Ser. No. 17/354,407, filed on Jun. 22, 2021, which claims benefit of the filing date of Chinese Patent Application No. 202011142827.8 filed on Oct. 22, 2020, the disclosure of which is hereby incorporated in its entirety by reference.

TECHNICAL FIELD

The present disclosure relates to the technical field of photoelectric detection, in particular to a detection base plate and a flat-panel detector.

BACKGROUND

With the continuous development of the X-ray digital imaging technology, flat panel X-ray detectors (FPXDs) are directly used to convert X images into digital images and have broad application prospects in the medical field, the security field, the industrial detection field, and the like.

The FPXD comprises a detection base plate provided with multiple thin-film transistors and multiple photodiodes (PIN). At present, the thin-film transistors are typically amorphous silicon (a-Si) thin-film transistors. Indium Gallium Zinc Oxide (IGZO) thin-film transistors with a carrier mobility of 5-20 are able to meet the requirements of application scenarios.

SUMMARY

The embodiments of the present disclosure provide a detection base plate and a flat-panel detector.

In order to achieve the above object, the embodiments of the present disclosure employ the following technical solutions:

In an aspect, there is provided a detection base plate, comprising a substrate and multiple detection pixel units located on the substrate and arranged in an array;
  each said detection pixel unit comprising: a thin-film transistor, a sacrificial layer and a photoelectric conversion layer disposed on the substrate; the sacrificial layer being located between the thin-film transistor and the photoelectric conversion part;
  wherein the thin-film transistor comprises an active layer, a first electrode and a second electrode;
  at least part of an orthographic projection of the active layer on the substrate is located within an orthographic projection of the sacrificial layer on the substrate;
  the photoelectric conversion part is electrically connected to the sacrificial layer and the first electrode; and
  in the detection base plate, the sacrificial layers of the detection pixel units are mutually independent;
  wherein the photoelectric conversion part is disposed on a side, away from the substrate, of the thin-film transistor;
  the photoelectric conversion part comprises a read electrode;
  in the detection pixel units, the sacrificial layers contact with the read electrode; and
  at least part of a boundary of an orthographic projection of the read electrode on the substrate is located within a boundary of the orthographic projection of the sacrificial layer on the substrate.

Optionally, the orthographic projection of the active layer on the substrate is located within the orthographic projection of the sacrificial layer on the substrate.

Optionally, the read electrodes of the photoelectric conversion parts of the detection pixel units are mutually independent.

Optionally, the detection pixel unit further comprises a first insulating layer and a first via hole, and the first via hole penetrates through the first insulating layer to expose the first electrode; and
  the sacrificial layer does not contact with the first electrode, and the read electrode contacts with the first electrode by means of the first via hole.

Optionally, the orthographic projection of the sacrificial layer on the substrate does not overlap with or partially overlaps with an orthographic projection of the first via hole on the substrate.

Optionally, the first insulating layer comprises a first passivation layer and a first organic layer, and the first passivation layer covers the thin-film transistor; and
  the first organic layer is located between the first passivation layer and the sacrificial layer.

Optionally, the photoelectric conversion part further comprises a photoelectric conversion structure disposed on a side, away from the substrate, of the read electrode; and
  an orthographic projection of the photoelectric conversion structure on the substrate does not overlap with the orthographic projection of the first via hole on the substrate.

Optionally, a boundary of the orthographic projection of the photoelectric conversion structure on the substrate is located within a boundary of the orthographic projection of the read electrode on the substrate.

Optionally, the detection pixel unit further comprises: a second insulating layer, a bias electrode and a third passivation layer that are sequentially stacked on the photoelectric conversion part;
  wherein the bias electrode is electrically connected to the photoelectric conversion part by means of the second via hole, and the second via hole penetrates through the second insulating layer.

Optionally, the second insulating layer comprises a second passivation layer and a second organic layer, and the detection pixel unit further comprises: an electrically conductive electrode located between the photoelectric conversion part and the second organic layer and contacting with the photoelectric conversion part.

Optionally, the photoelectric conversion part comprises a read electrode and a photoelectric conversion structure;
  the photoelectric conversion structure is disposed on a side, away from the substrate, of the read electrode, and comprises a first doping layer, an intrinsic layer and a second doping layer that are sequentially stacked on the read electrode, and a polarity of the first doping layer is opposite to a polarity of the second doping layer; and
  the first doping layer contacts with the read electrode, and the second doping layer contacts with the electrically conductive electrode.

Optionally, an orthographic projection of the electrically conductive electrode on the substrate may be located within an orthographic projection of the photoelectric conversion part on the substrate.

Optionally, the detection base plate further comprises multiple grid lines arranged in a first direction and multiple data lines arranged in a second direction, wherein in the detection pixel units, the orthographic projections of the sacrificial layers on the substrate do not overlap with orthographic projections of the grid lines on the substrate and do not overlap with orthographic projections of the data lines on the substrate either.

Optionally, in the detection pixel units, the sacrificial layers comprise first parts and second parts, and portions, close to the grid lines or the data lines, of the first parts protrude out of the second parts; and a line width of portions, close to the first parts, of the data lines is smaller than that of portions, close to the second parts, of the data lines, and a line width of portions, close to the first parts, of the grid lines is smaller than that of portions, close to the second parts, of the grid lines.

Optionally, the detection pixel unit further comprises: a bias electrode electrically connected to the photoelectric conversion part; and the detection base plate further comprises multiple bias lines arranged in the second direction, and the bias lines are electrically connected to the bias electrodes of at least one row of detection pixel units arranged in the first direction.

Optionally, when the thin-film transistor is an N-type thin-film transistor, the first electrode is a drain, and the second electrode is a source; or when the thin-film transistor is a P-type thin-film transistor, the first electrode is a source, and the second electrode is a drain.

In another aspect, there is provided a detection base plate, comprising a substrate and multiple detection pixel units located on the substrate and arranged in an array;

each said detection pixel unit comprising: a thin-film transistor, a sacrificial layer and a photoelectric conversion layer disposed on the substrate; the sacrificial layer being located between the thin-film transistor and the photoelectric conversion part;

wherein the thin-film transistor comprises an active layer, a first electrode and a second electrode;

at least part of an orthographic projection of the active layer on the substrate is located within an orthographic projection of the sacrificial layer on the substrate;

the photoelectric conversion part is electrically connected to the sacrificial layer and the first electrode; and in the detection base plate, the sacrificial layers of the detection pixel units are mutually independent;

wherein the photoelectric conversion part is disposed on a side, away from the substrate, of the thin-film transistor;

wherein the detection pixel unit further comprises a first insulating layer and a first via hole, and the first via hole penetrates through the first insulating layer to expose the first electrode;

the sacrificial layer does not contact with the first electrode, and the read electrode contacts with the first electrode by means of the first via hole;

the photoelectric conversion part further comprises a photoelectric conversion structure disposed on a side, away from the substrate, of the read electrode; and an orthographic projection of the photoelectric conversion structure on the substrate does not overlap with the orthographic projection of the first via hole on the substrate.

In another aspect, there is provided a detection base plate, comprising a substrate and multiple detection pixel units located on the substrate and arranged in an array;

each said detection pixel unit comprising: a thin-film transistor, a sacrificial layer and a photoelectric conversion layer disposed on the substrate; the sacrificial layer being located between the thin-film transistor and the photoelectric conversion part;

wherein the thin-film transistor comprises an active layer, a first electrode and a second electrode;

at least part of an orthographic projection of the active layer on the substrate is located within an orthographic projection of the sacrificial layer on the substrate;

the photoelectric conversion part is electrically connected to the sacrificial layer and the first electrode; and in the detection base plate, the sacrificial layers of the detection pixel units are mutually independent;

wherein in the detection pixel units, the sacrificial layers comprise first parts and second parts, and portions, close to the grid lines or the data lines, of the first parts protrude out of the second parts; and a line width of portions, close to the first parts, of the data lines is smaller than that of portions, close to the second parts, of the data lines, and a line width of portions, close to the first parts, of the grid lines is smaller than that of portions, close to the second parts, of the grid lines.

In another aspect, there is provided a flat-panel detector, comprising the detection base plate stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

To more clearly explain the technical solutions of the embodiments of the present disclosure or the related art, drawings required for describing the embodiments of the present disclosure or the related art will be briefly introduced below. Obviously, the drawings in the following description merely illustrate some embodiments of the present disclosure, and those ordinarily skilled in the art may obtain other drawings according to the following ones without creative labor.

DETAILED DESCRIPTION

The technical solutions of the embodiments of the present disclosure will be clearly and comprehensively described below in conjunction with the accompanying drawings of the embodiments. Obviously, the embodiments in the following description are merely illustrative ones, and are not all possible ones of the present disclosure. All other embodiments obtained by those ordinarily skilled in the art without creative labor should also fall within the protection scope of the present disclosure.

In the embodiments of the present disclosure, terms such as "first" and "second" are used to distinguish identical or similar items with basically the same function and effect merely for the purpose of clearly describing the technical solutions of the embodiments of the present disclosure, and should not be construed as indicating or implying relative importance or implicitly indicating the number of technical features referred to.

In the embodiments of the present disclosure, "multiple" refers to two or more, and "multiple pieces" refers to two or more pieces, unless otherwise clearly specified.

In the embodiments of the present disclosure, terms such as "upper" and "lower" are used to indicate directional or positional relations based on the accompanying drawings merely for the purpose of facilitating and simplifying the description of the present disclosure, do not indicate or imply that devices or elements referred to must be in a specific direction, or be configured and operated in a specific direction, and thus, should not be construed as limitations of the present disclosure.

Figure 5:
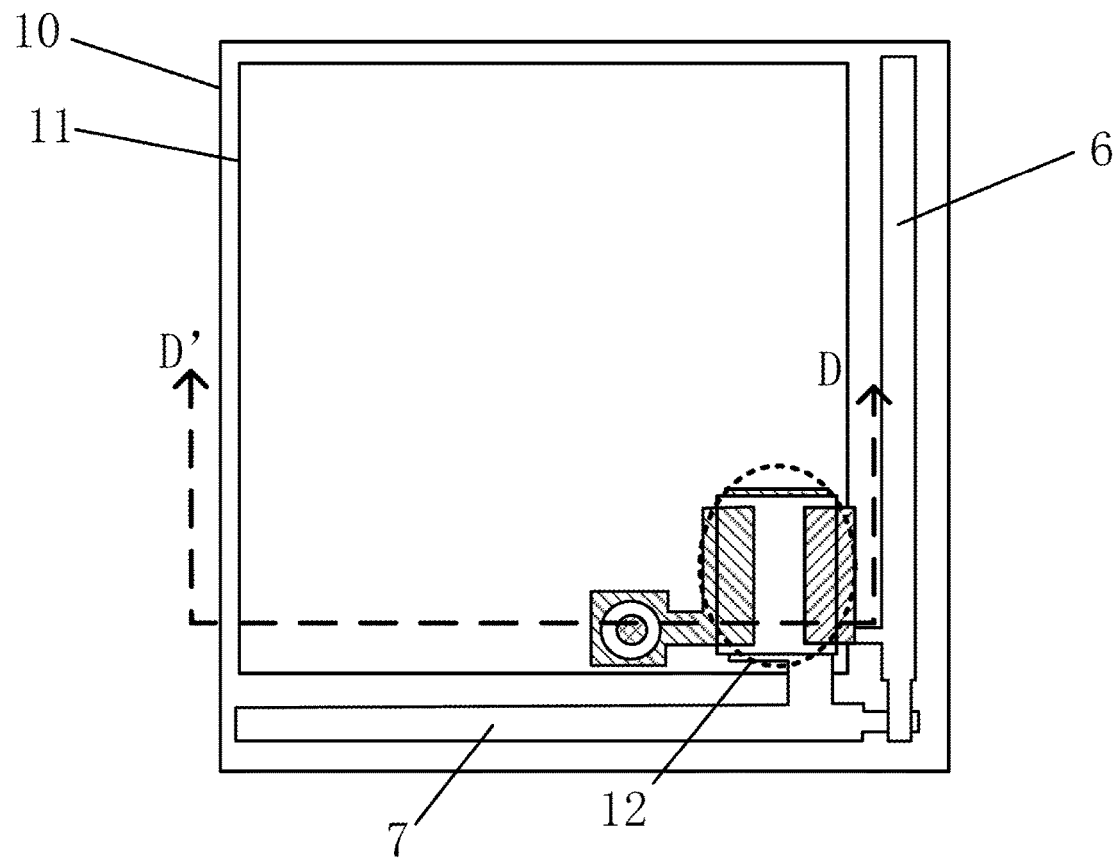
FIG. 5 is a structural diagram of a detection pixel unit according to another embodiment of the present disclosure.
Figure 6:
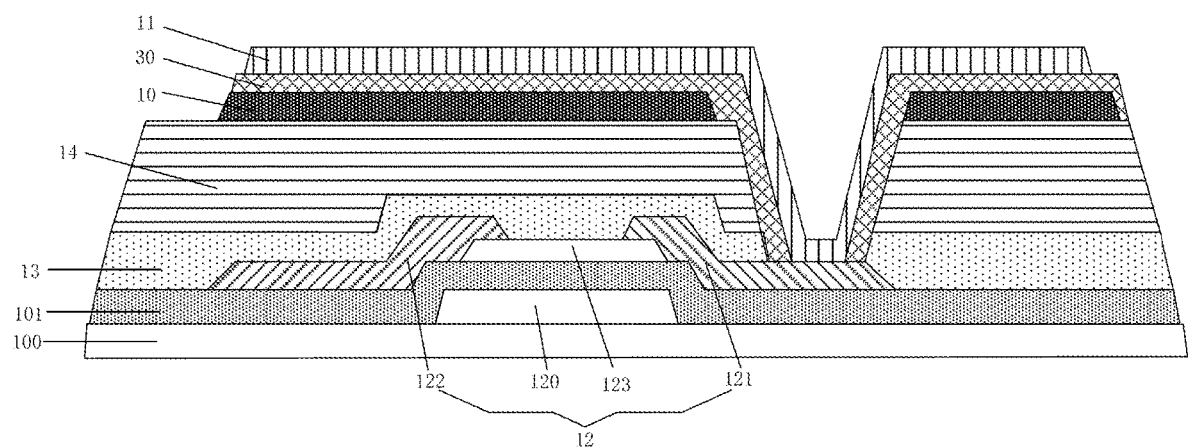
FIG. 6 is a sectional view along DD' in FIG. 5.

FIG. 5 is a structural diagram of a detection pixel unit according to one embodiment of the present disclosure, and FIG. 6 is a sectional view along DD' in FIG. 5. As shown in FIG. 5 and FIG. 6, in the detection base plate, each detection pixel unit comprises a substrate 100, and a thin-film transistor 12, a first passivation layer 13, a first organic layer 14, a sacrificial layer 10, an insulating layer 10 and a read electrode 12 that are sequentially stacked on the substrate 100. The sacrificial layers in the detection pixel units are connected to cover the whole substrate and are insulated from the read electrodes. According to the detection base plate, the influence of hydrogen atoms on the thin-film transistors is avoided in the manufacturing process. But, the inventor finds that, when the detection base plate is finally tested, bright images cannot be collected and dark images have to be initialized several times. After a deep analysis, a test is performed again after a constant potential is applied to the sacrificial layers, and the test result indicates that the detection base plate is able to collect dark images normally. But, when a tungsten plate is used to test the properties, the detection base plate suffers from the problem of signal interference and is still unable to work normally.

Figure 1:
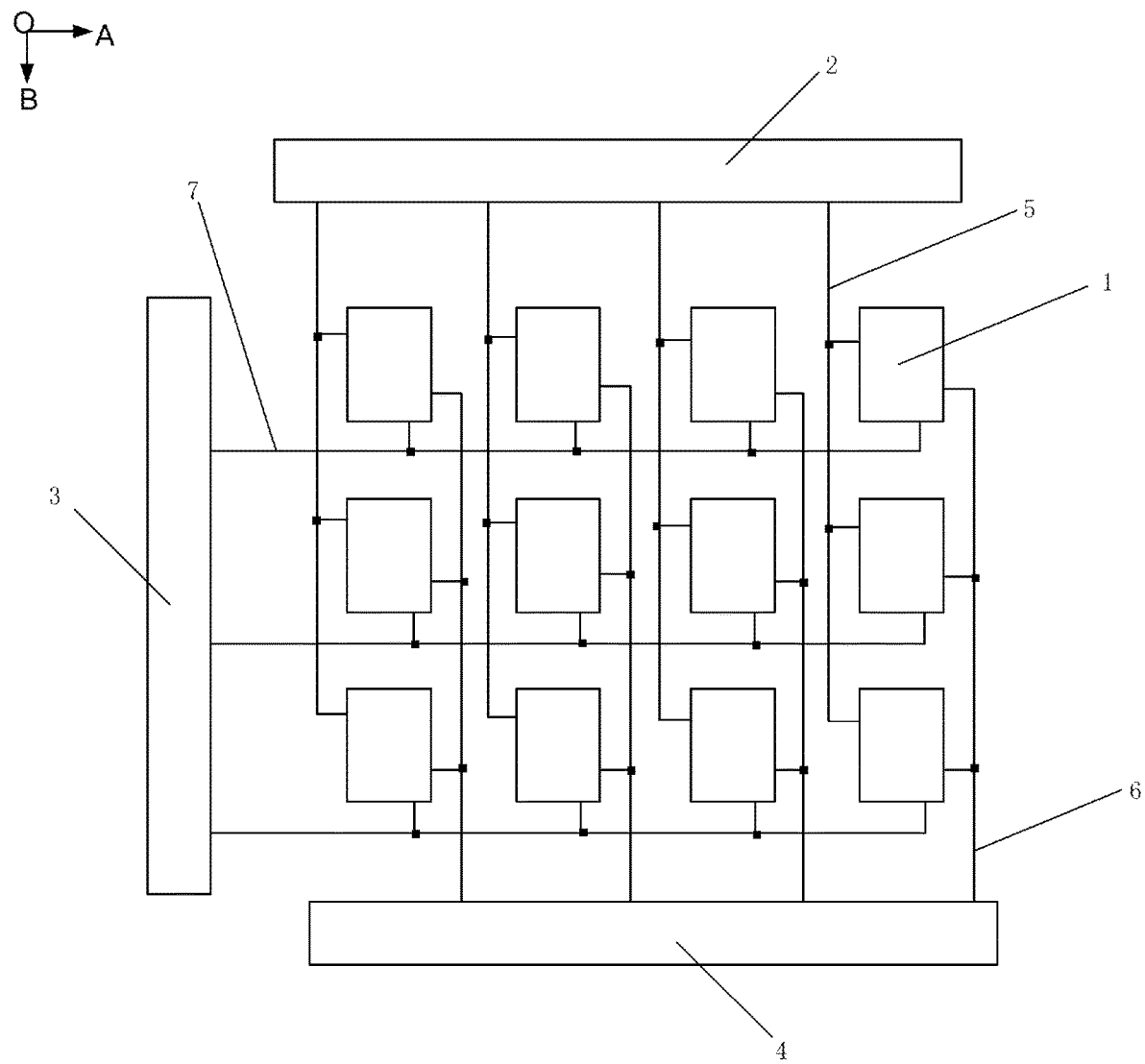
FIG. 1 is a structural diagram of a detection base plate according to one embodiment of the present disclosure.

Upon a careful study, the present disclosure puts forwards a novel detection base plate on the basis of the above detection base plate. As shown in FIG. 1, the detection base plate comprises a substrate (not shown in FIG. 1) and multiple detection pixel units 1 located on the substrate and arranged in an array.

As shown in FIG. 2 and FIG. 3a-FIG. 3c, each detection pixel unit comprises a thin-film transistor 12, a sacrificial layer 10 and a photoelectric conversion part that are disposed on the substrate 100, wherein the sacrificial layer 10 is located between the thin-film transistor and the photoelectric conversion part.

Figure 3A:
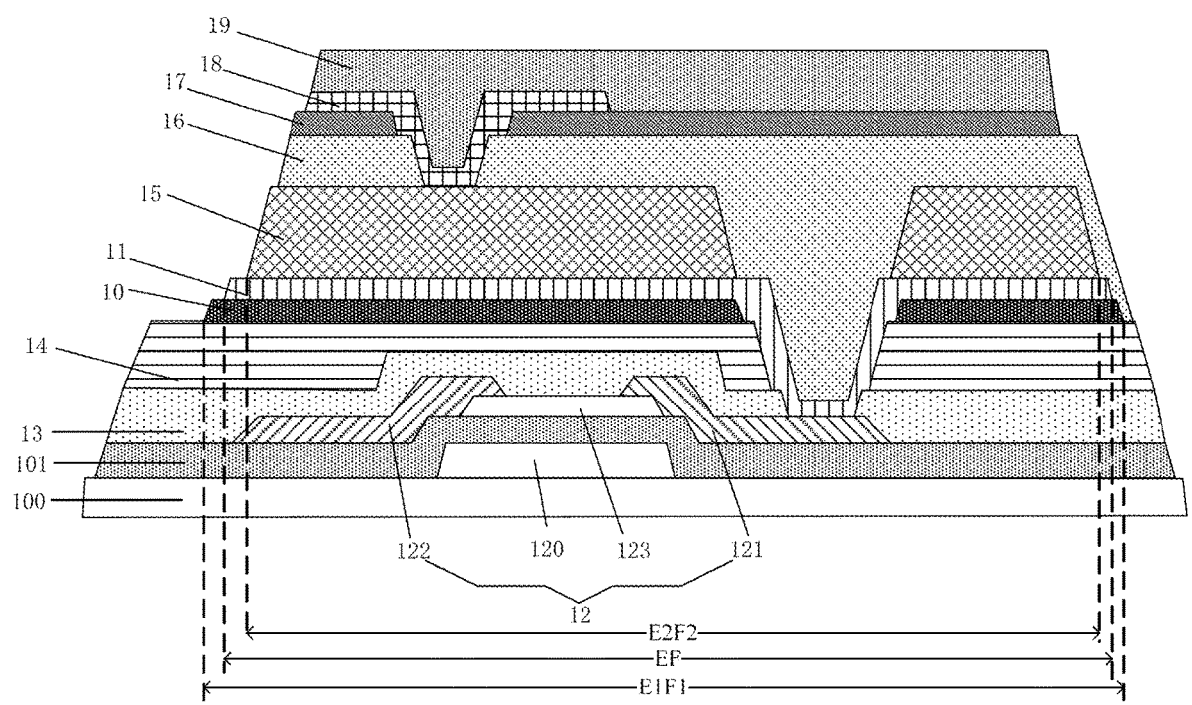
FIG. 3a, FIG. 3b and FIG. 3c are three sectional views along CC' in FIG. 2.
Figure 3B:
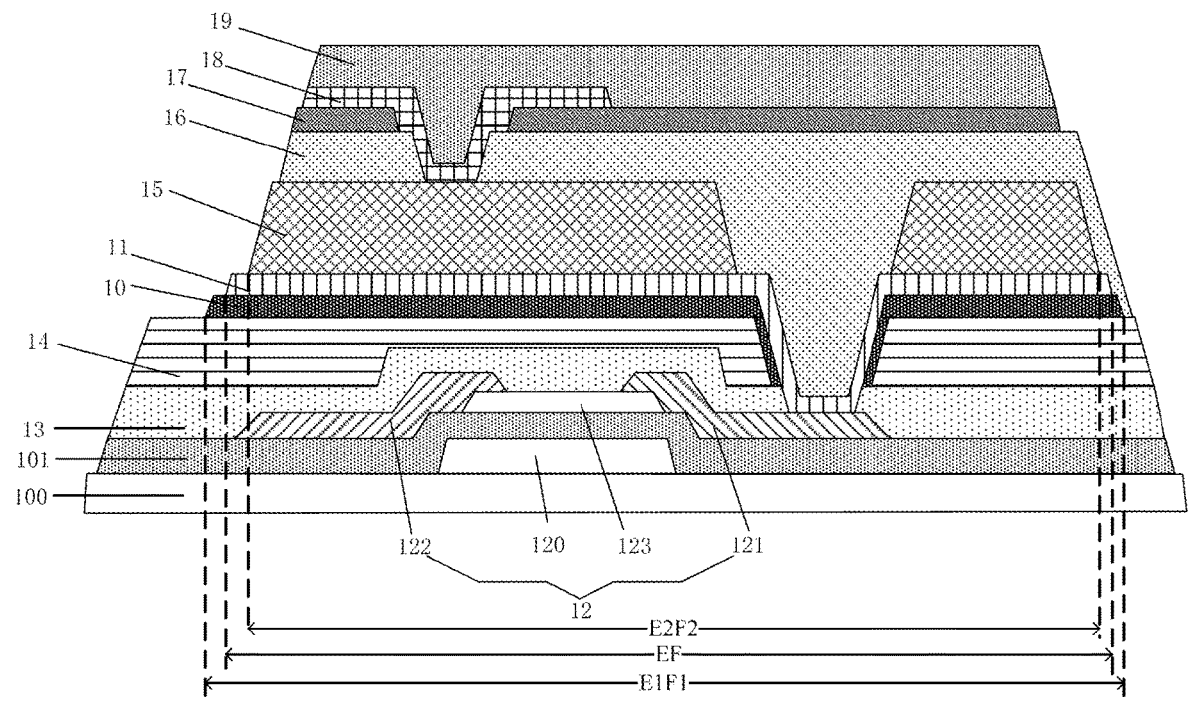
Figure 3C:
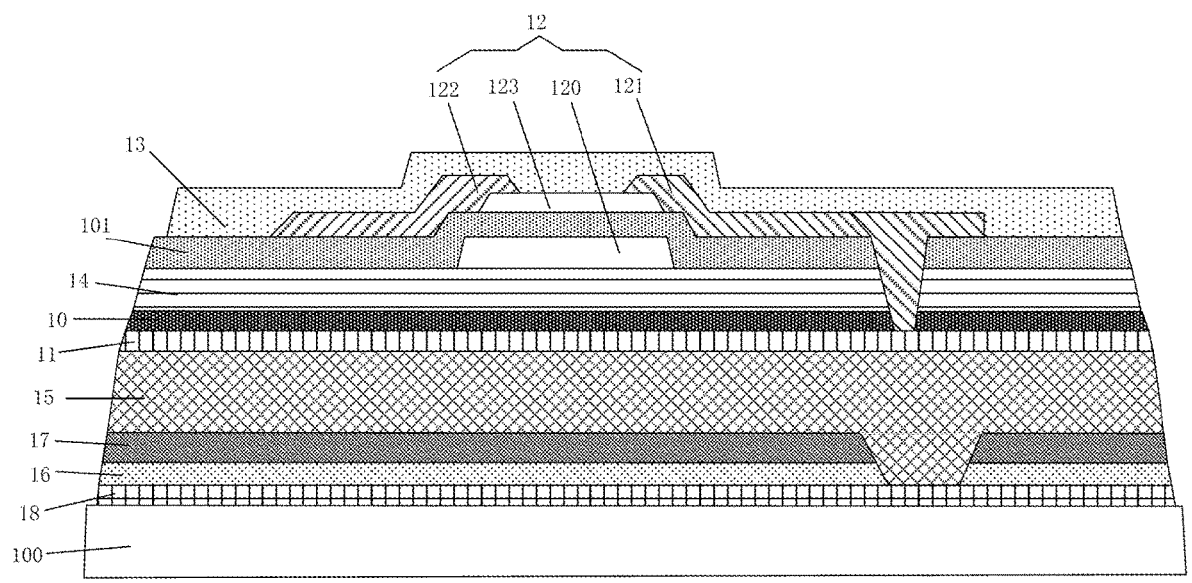

As shown in FIG. 3a-FIG. 3c, the thin-film transistor 12 comprises an active layer 123, a first electrode 121 and a second electrode 122; the first electrode 121 and the second electrode 122 are electrically connected to the active layer 123, and the active layer is made of a metal oxide; at least part of an orthographic projection of the active layer 123 on the substrate is located within an orthographic projection of the sacrificial layer 10 on the substrate; and the photoelectric conversion part is electrically connected to the sacrificial layer and the first electrode.

In the detection base plate, the sacrificial layers of the detection pixel units are mutually independent.

Figure 10:
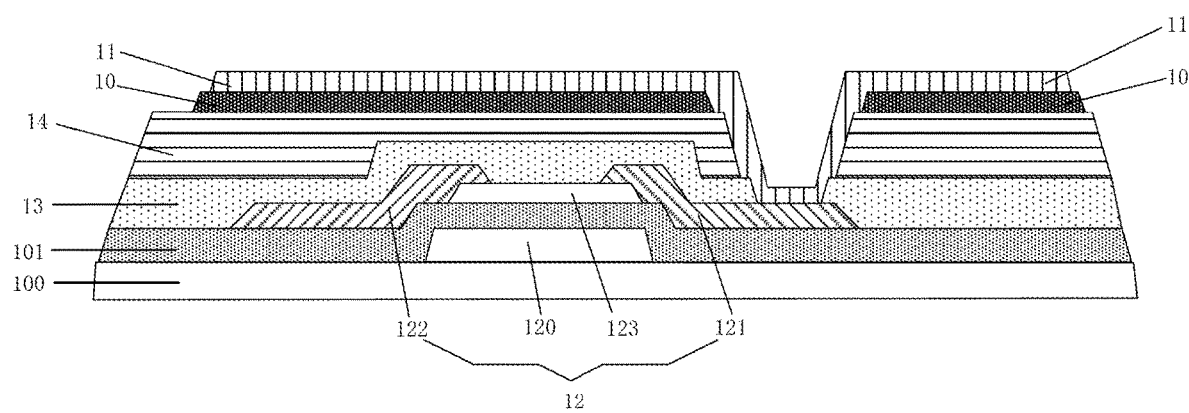
FIG. 10 is another sectional view along CC' in FIG. 2.

The photoelectric conversion part is able to convert light energy into electric energy, and the specific structure of the photoelectric conversion part is not limited. For example, as shown in FIG. 3a-FIG. 3c, the photoelectric conversion part may comprise a read electrode 11 and a photoelectric conversion structure 15. The present disclosure has no limitation to the material of the read electrode. For example, the read electrode may be made of a metal or a metal alloy. To increase the read rate, the read electrode may be made of a high-conductivity metal such as molybdenum, aluminum, silver, copper, titanium, platinum or tungsten. The photoelectric conversion structure may comprise a photodiode (PIN) which may comprise a first doping layer 151, an intrinsic layer 150 and a second doping layer 152, as shown in FIG. 10. In addition, the photoelectric conversion parts of the detection pixel units are mutually independent, and the read electrodes of the photoelectric conversion parts of the detection pixel units are also mutually independent, so that mutual influences of the adjacent photoelectric conversion parts are avoided, and the detection accuracy will not be reduced.

The relative positions of the thin-film transistor and the photoelectric conversion part are not limited here. As shown in FIG. 3a and FIG. 3b, the photoelectric conversion part may be disposed on a side, away from the substrate, of the thin-film transistor. Or, as shown in FIG. 3c, the photoelectric conversion part may be disposed on a side, close to the substrate, of the thin-film transistor.

In the thin-film transistor, the first electrode and the second electrode may be a drain and a source respectively, and the functions of the first electrode and the second electrode may be exchanged according to different types of thin-film transistors and different input signals, and are not specifically distinguished here. For example, if the thin-film transistor is an N-type thin-film transistor, the first electrode may be a drain, and the second electrode may be a source. If the thin-film transistor is a P-type thin-film transistor, the first electrode may be a source, and the second electrode may be a drain.

As shown in FIG. 3a-FIG. 3c, the thin-film transistor 12 may further comprise a gate 120. The thin-film transistor may be a bottom-gate thin-film transistor shown in FIG. 3a-FIG. 3c (the source and the drain are disposed above the gate); or, the thin-film transistor may be a top-gate thin-film transistor (the source and the drain are disposed below the gate). The present disclosure has not limitation in this aspect. It should be noted that in the top-gate thin-film transistor, the gate is able to protect the active layer to some extent by preventing part of hydrogen atoms from diffusing into the active layer in the manufacturing process. In the bottom-gate thin-film transistor, the gate is unable to protect the active layer, the active layer will be severely affected by hydrogen atoms, and in this case, the sacrificial layer is of particular importance in protecting the thin-film transistor.

In the thin-film transistor, the first electrode, the second electrode and the gate may be made of metals such as molybdenum, aluminum, silver, copper, titanium, platinum and tungsten, or other electrically conductive materials such as metal alloys, as actually needed.

"At least part of the orthographic projection of the active layer on the substrate is located within the orthographic projection of the sacrificial layer on the substrate" means that part of the orthographic projection of the active layer on the substrate is located within the orthographic projection of the sacrificial layer on the substrate, or the whole orthographic projection of the active layer on the substrate is located within the orthographic projection of the sacrificial layer on the substrate, as shown in FIG. 3a-FIG. 3c. To protect, to the maximum extent, the active layer from being reduced by hydrogen atoms, the latter is preferred.

The present disclosure has no limitation to the material of the substrate. The substrate may be made of a rigid material such as glass, or a flexible material such as polyimide (PI).

The detection base plate may be applied to an FPXD, the FPDR may be a direct DR detector or an indirect DR detector, and the present disclosure has no limitation in this aspect. The indirect DR FPXD is relatively mature in technique, low in cost, high in detective quantum efficiency (DQE) and good in reliability, thus having been widely developed and applied. The principle of the indirect DR FPXD is as follows: irradiated by X-rays, a scintillant layer or a fluorescent layer of the indirect DR FPXD converts X-ray photons into visible light, which is in turn converted into an electric signal by the photoelectric conversion parts, and finally, the electric signal is read and output by the thin-film transistors to obtain a display image.

Of course, the detection base plate may also be applied to other products adopting metal oxide thin-film transistors. After the metal oxide thin-film transistors of such products are manufactured, the detection base plate is able to protect, to the maximum extent, the metal oxide thin-film transistors from being reduced in a high-hydrogen, high-water and high-oxygen sensitive environment in the subsequent process, thus improving the stability of the metal oxide thin-film transistors.

Figure 2:
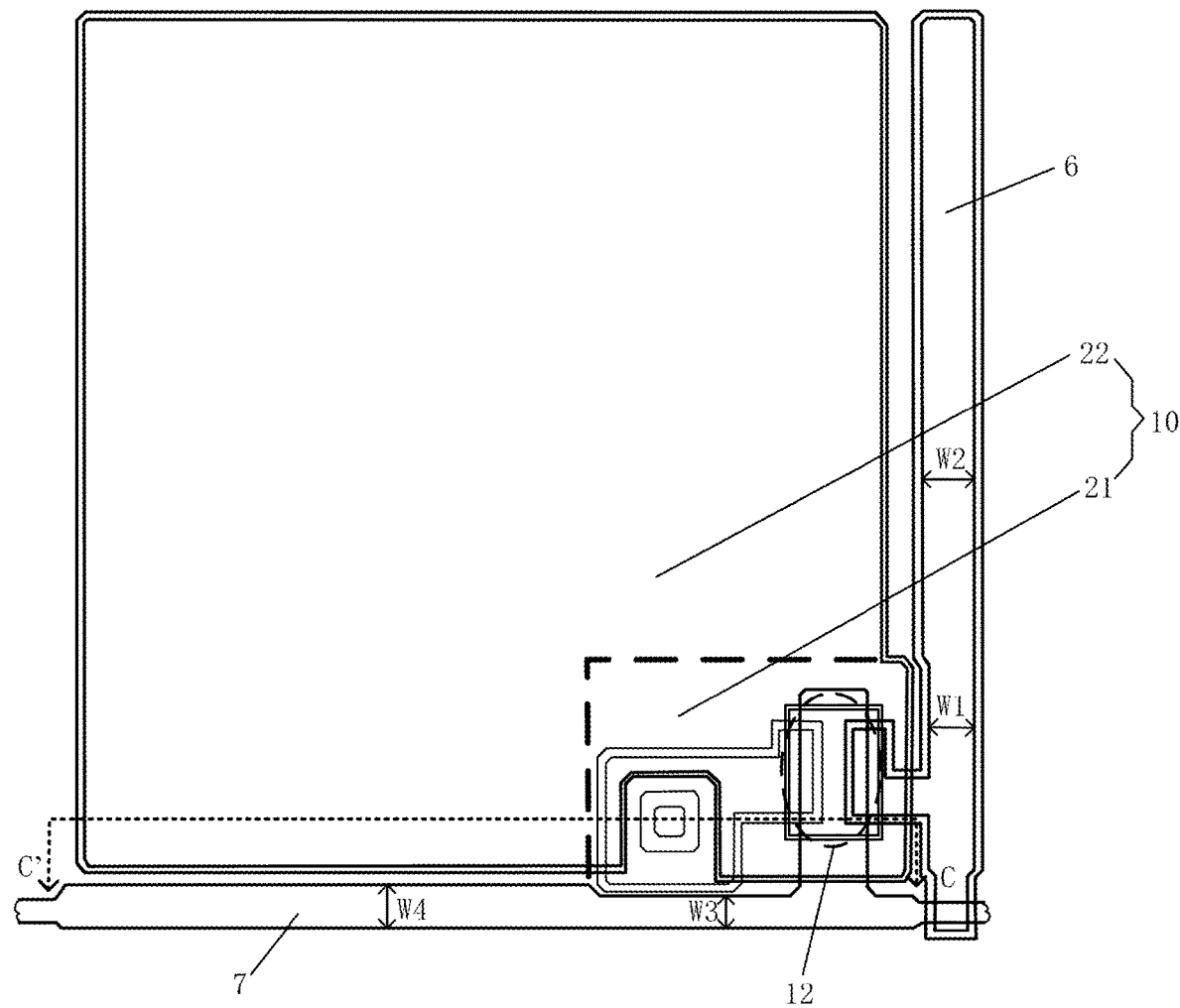
FIG. 2 is a structural diagram of a detection pixel unit according to one embodiment of the present disclosure.

FIG. 2 is a structural diagram of the detection pixel unit according to one embodiment of the present disclosure, and FIG. 3a, FIG. 3b and FIG. 3c are three sectional views along CC' in FIG. 2.

Figure 4:
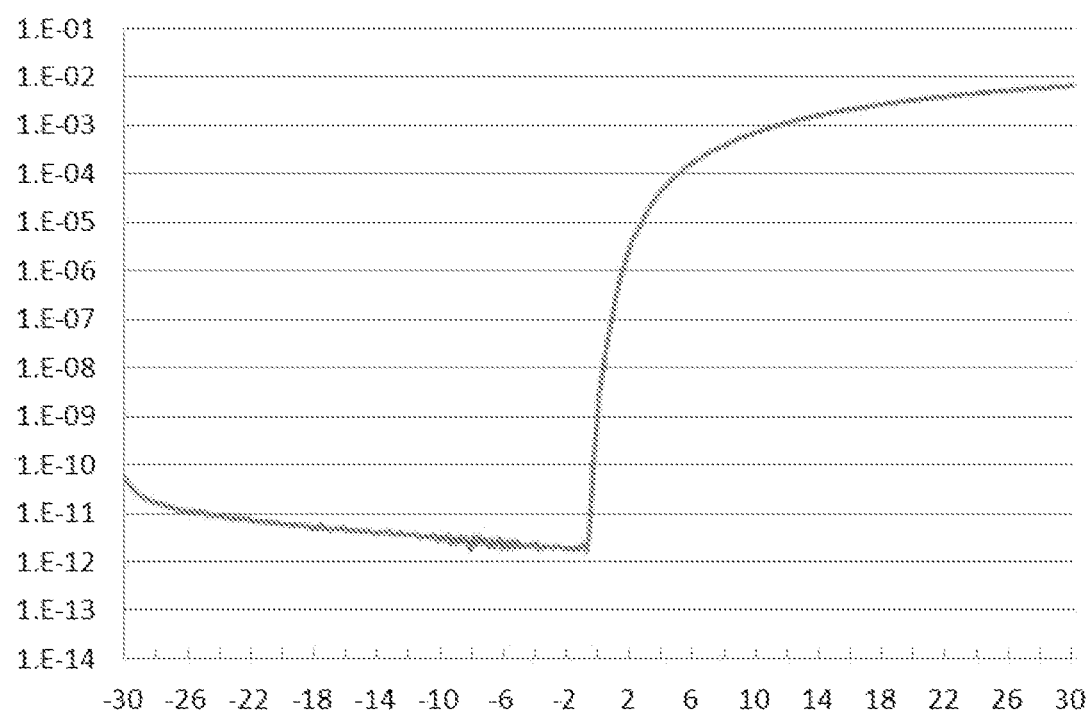
FIG. 4 is a curve chart of the transfer characteristic of thin-film transistors according to one embodiment of the present disclosure.

According to the detection base plate provided by the embodiments of the present disclosure, the sacrificial layers in the detection pixel units are located between the thin-film transistors and the photoelectric conversion parts, and the orthographic projections of the sacrificial layers on the substrate at least partially overlap with the orthographic projections of the active layers on the substrate, so that hydrogen atoms generated in the manufacturing process are prevented by the sacrificial layers from infiltrating into the thin-film transistors to protect, to the maximum extent, the thin-film transistors from being reduced, thus greatly improving the stability of the thin-film transistors, and accordingly, improving the performance of a flat-panel detector. Referring to FIG. 4, the thin-film transistors of the detection base plate have a good switching characteristic. FIG. 4 is a curve chart of the transfer characteristic of the thin-film transistors, wherein the horizontal axis represents the voltage (unit: V), and the longitudinal axis represents the current (unit: A).

In addition, compared with the detection base plate shown in FIG. 6, in the detection pixel units provided by the embodiments of the present disclosure, the sacrificial layers are electrically connected to the photoelectric conversion parts, so that no capacitance will be generated between the sacrificial layers and the photoelectric conversion parts. Moreover, the sacrificial layers of the detection pixel units are mutually independent and will not be influenced by one another, so that the problem of signal interference is solved, and the product performance is further improved.

Optionally, as shown in FIG. 3a and FIG. 3b, the photoelectric conversion part is disposed on a side, away from the substrate, of the thin-film transistor. So, when the detection base plate is manufactured, the thin-film transistor is formed at first, and then the photoelectric conversion part is manufactured. In this way, after the thin-film transistor is formed, the sacrificial layer will be subjected to a chemical reaction with hydrogen atoms in the subsequent manufacturing process to consume and block the hydrogen atoms so as to prevent the hydrogen atoms from diffusing to the thin-film transistor, so that the thin-film transistor is prevented to the maximum extent from being reduced, thus greatly improving the stability of the thin-film transistor, and accordingly, improving the performance of the flat-panel detector. FIG. 4 is a curve chart of the transfer characteristic of the thin-film transistors, wherein the horizontal axis represents the voltage (unit: V), and the longitudinal axis represents the current (unit: A).

In the detection base plate shown in FIG. 3c, the photoelectric conversion part is disposed on a side, close to the substrate 100, of the thin-film transistor 12. So, when the detection base plate is manufactured, the photoelectric conversion part is formed at first, and then the thin-film transistor is manufactured. In this way, the thin-film transistor is formed in a high-temperature environment, and in this high-temperature environment, the photoelectric conversion part (comprising the read electrode 11 and the photoelectric conversion structure 15), a second passivation layer 17 and a second organic layer 16 that have been formed may generate many harmful substances, which may affect and reduce the thin-film transistor. The sacrificial layer 10 fulfills a physical barrier effect to protect the thin-film transistor.

Further optionally, to further prevent the thin-film transistor from being reduced, the orthographic projection of the active layer on the substrate is located within the orthographic projection of the sacrificial layer on the substrate.

Optionally, as shown in FIG. 3a and FIG. 3b, the photoelectric conversion part comprises the read electrode 11. In the detection pixel units, the sacrificial layers 10 contact with the read electrodes 11.

The contact manner of the sacrificial layer and the read electrode is not limited here. For example, as shown in FIG. 3a and FIG. 3b, the sacrificial layer 10 contacts with two opposite sides of the read electrode 11 face to face. Of course, the sacrificial layer may contact with the read electrode only at the boundary. To further avoid a capacitance between the sacrificial layer and the read electrode, the former contact structure is preferred.

The sacrificial layer and the read electrode are in contact to realize electrical connection to avoid a capacitance therebetween, so that signal interference of the detection base plate shown in FIG. 6 is avoided, and the product performance is further improved.

Optionally, to simplify the structure and lower the manufacturing difficulty, the detection pixel unit further comprises a first passivation layer 13, a first organic layer 14 and a first via hole (not show in FIG. 3), as show in FIG. 3a and FIG. 3b, wherein the first via hole penetrates through the first passivation layer and the first organic layer to expose the first electrode. The sacrificial layer does not contact with the first electrode, and the read electrode contacts with the first electrode by means of the first via hole.

As shown in FIG. 3a and FIG. 3b, the first passivation layer 13 covers the thin-film transistor 12 to fulfill a protection and insulation effect, and may be made of silicon nitride, silicon oxide, or silicon oxynitride. The first organic layer 14 is located between the first passivation layer 13 and the sacrificial layer 10 to fulfill an insulation and planarization effect, and may be made of an organic resin material such as polyacrylic resin, epoxy acrylate resin, polyester acrylate or polyurethane acrylate resin.

As shown in FIG. 3a, the sacrificial layer 10 may be disposed on a side, away from the substrate, of the first organic layer 14 only, and is not located in the first via hole. Or, the sacrificial layer may extend into the first via hole. As shown in FIG. 3b, the sacrificial layer 10 may extend into the first via hole, that is, the sacrificial layer 10 is disposed on a side wall of the first via hole and covers the first organic layer 14 on the side wall of the first via hole. Or, the sacrificial layer may cover the first passivation layer on the side wall of the first via hole as long as it does not contact with the first electrode.

Optionally, the orthographic projection of the sacrificial layer on the substrate does not overlap with or partially overlaps with an orthographic projection of the first via hole on the substrate.

As shown in FIG. 3a, the orthographic projection of the sacrificial layer on the substrate does not overlap with the orthographic projection of the first via hole on the substrate. In this case, the sacrificial layer may be disposed around an area where the first via hole is located; or, a hollow structure may be disposed in the area where the first via hole is located. The present disclosure has no limitation in this aspect. FIG. 2 is drawn with the former as an example. The structure is simple in manufacturing process and easy to obtain.

As shown in FIG. 3b, the orthographic projection of the sacrificial layer on the substrate partially overlaps with the orthographic projection of the first via hole on the substrate, that is, the sacrificial layer extends into the first via hole. In this structure, the sacrificial layer has a larger coverage area and is able to prevent hydrogen atoms generated in the area of the first via hole from diffusing to the active layer in the manufacturing process, thus more comprehensively protecting the thin-film transistor.

Optionally, at least part of the boundary of an orthographic projection of the read electrode on the substrate is located within the orthographic projection of the sacrificial layer on the substrate.

In the detection base plate, part of the boundary of the orthographic projection of the read electrode on the substrate is located within the orthographic projection of the sacrificial layer on the substrate; or, the whole boundary of the orthographic projection of the read electrode on the substrate is located within the orthographic projection of the sacrificial layer on the substrate. Or, the whole boundary of the orthographic projection of the sacrificial layer on the substrate may be located within the boundary of the orthographic projection of the read electrode on the substrate; or, the boundary of the orthographic projection of the read electrode on the substrate may coincides with the boundary of the orthographic projection of the sacrificial layer on the substrate.

The two cases will be specifically described below.

In the first case, as shown in FIG. 3a, the boundary of the orthographic projection of the read electrode 11 on the substrate 100 is located within the boundary of the orthographic projection E1F1 of the sacrificial layer 10 on the substrate 100.

The boundary of the orthographic projection of the read electrode on the substrate refers to an outer boundary of the orthographic projection of the read electrode on the substrate, and the boundary of the orthographic projection of the sacrificial layer on the substrate refers to an outer boundary of the orthographic projection of the sacrificial layer on the substrate.

In this case, a flat read electrode is formed, and the photoelectric conversion structure subsequently formed on the read electrode is also flat, which is beneficial for improving the performance of the photoelectric conversion structure.

In the second case, the boundary of the orthographic projection of the read electrode on the substrate is located outside the boundary of the orthographic projection of the sacrificial layer on the substrate.

The boundary of the orthographic projection of the read electrode on the substrate refers to an outer boundary of the orthographic projection of the read electrode on the substrate, and the boundary of the orthographic projection of the sacrificial layer on the substrate refers to an outer boundary of the orthographic projection of the sacrificial layer on the substrate.

In this case, the size of the read electrode may be a bit larger, and the size of the sacrificial layer may be a bit smaller, so that the read rate of the read electrode is increased. However, the read electrode may generate a drop at the edge of the sacrificial layer, which is not beneficial to the formation of a flat photoelectric conversion structure.

Optionally, as shown in FIG. 3a and FIG. 3b, the photoelectric conversion part further comprises the photoelectric conversion structure 15 disposed on a side, away from the substrate 100, of the read electrode 11; and an orthographic projection of the photoelectric conversion structure on the substrate does not overlap with the orthographic projection of the first via hole on the substrate.

The orthographic projection of the photoelectric conversion structure on the substrate does not overlap with the orthographic projection of the first via hole on the substrate, that is to say, the photoelectric conversion part is not located in the first via hole. So, the photoelectric conversion structure may be disposed around the area where the first via hole is located; or, a hollow structure may be disposed in the area where the first via hole is located. The present disclosure has no limitation in this aspect.

In this way, a flat photoelectric conversion part may be formed to improve the performance of the photoelectric conversion part. Of course, the photoelectric conversion part may cover the first via hole to increase the filling rate; however, in this case, the bottom of the photoelectric conversion part is not flat, and the photoelectric conversion performance of the photoelectric conversion part is unsatisfying.

Further optionally, to increase the read rate of the read electrode, the boundary of the orthographic projection E2F2 of the photoelectric conversion structure 15 on the substrate 100 is located within the boundary of the orthographic projection EF of the read electrode 11 on the substrate 100, as shown in FIG. 3a and FIG. 3b.

The boundary of the orthographic projection of the photoelectric conversion structure on the substrate refers to an outer boundary of the orthographic projection of the photoelectric conversion structure on the substrate, and the boundary of the orthographic projection of the read electrode on the substrate refers to an outer boundary of the orthographic projection of the read electrode on the substrate.

It should be noted that the case where the boundary of the orthographic projection of the photoelectric conversion structure on the substrate coincides with the boundary of the orthographic projection of the read electrode on the substrate belongs to the above category.

Optionally, to better drive the photoelectric conversion part, the detection pixel unit further comprises: a second organic layer 16, a second passivation layer 17, a bias electrode 18 and a third passivation layer 19 that are sequentially stacked on the photoelectric conversion part, as shown in FIG. 3a and FIG. 3b.

The bias electrode is electrically connected to the photoelectric conversion part by means of a second via hole, and the second via hole penetrates through the second organic layer and the second passivation layer.

The bias electrode is electrically connected to the photoelectric conversion part to provide a bias voltage for the photoelectric conversion part. The bias electrode may be made of a transparent electrically conductive material such as indium tin oxide (ITO) or indium zinc oxide (IZO) to improve the light transmittance.

The second organic layer is able to fulfill an insulation and planarization effect, and may be made of an organic resin material such as polyacrylic resin, epoxy acrylate resin, polyester acrylate or polyurethane acrylate resin. The second organic layer and the first organic layer may be made of the same material or different materials, and the present disclosure has no limitation in this aspect.

The second passivation layer and the third passivation layer are able to fulfill a protection and insulation effect, and may be made of silicon nitride, silicon oxide, or silicon oxynitride. The second passivation layer, the third passivation layer and the first passivation layer may be made of the same material or different materials, and the present disclosure has not limitation in this aspect.

Further optionally, to improve the electric conductivity, the detection pixel unit further comprises: an electrically conductive electrode 20, as shown in FIG. 20, wherein the electrically conductive electrode 20 is located between the photoelectric conversion part and the second organic layer 16 and contacts with the photoelectric conversion part.

Here, an orthographic projection of the electrically conductive electrode on the substrate may be located within the orthographic projection of the photoelectric conversion part on the substrate. Referring to FIG. 10, if the photoelectric conversion part comprises the photoelectric conversion structure 15, the orthographic projection of the electrically conductive electrode on the substrate may be located within the orthographic projection of the photoelectric conversion structure on the substrate. Besides, the electrically conductive electrode may contact with the photoelectric conversion structure, so the bias electrode may be electrically connected to the photoelectric conversion part by means of the second via hole and the electrically conductive electrode.

The electrically conductive electrode may be made of a transparent electrically conductive material such as ITO or IZO to improve the light transmittance.

Optionally, as shown in FIG. 10, the photoelectric conversion part comprises a read electrode 11 and a photoelectric conversion structure 15, wherein the photoelectric conversion structure 15 is disposed on a side, away from the substrate 100, of the read electrode 11, and comprises a first doping layer 151, an intrinsic layer 150 and a second doping layer 152 that are sequentially stacked on the read electrode 11, and the polarity of the first doping layer is opposite to the polarity of the second doping layer; and the first doping layer 151 contacts with the read electrode 11, and the second doping layer 152 contacts with the electrically conductive electrode 20.

The first doping layer and the second doping layer may comprise N-type impurities or P-type impurities. The intrinsic layer does not comprise impurities. The thickness of the intrinsic layer may be greater than that of the first doping layer and the second doping layer.

If the first doping layer comprises N-type impurities and the second doping layer comprises P-type impurities, the first doping layer is an N-type semiconductor layer, the second doping layer is a P-type semiconductor layer, and in this case, a negative bias voltage may be input to the second doping layer by means of the bias electrode and the electrically conductive electrode. If the first doping layer comprises P-type impurities and the second doping layer comprises N-type impurities, the first doping layer is a P-type semiconductor layer, the second doping layer is an N-type semiconductor layer, and in this case, a forward bias voltage may be input to the second doping layer by means of the bias electrode and the electrically conductive electrode.

Optionally, as shown in FIG. 1, the detection base plate further comprises multiple grid lines 7 arranged in a first direction and multiple data lines 6 arranged in a second direction. As shown in FIG. 2, in the detection pixel unit, the orthographic projection of the sacrificial layer 10 on the substrate does not overlap with an orthographic projection of the grid line 7 on the substrate and does not overlap with an orthographic projection of the data line 6 on the substrate either.

It should be noted that the grid lines 7 and the data lines 6 are crossed to form multiple defined areas, as shown in FIG. 1. The detection pixel units 1 are located in the defined areas, the first direction intersects with the second direction, and FIG. 1 is drawn under the condition that the first direction perpendicularly intersects with the second direction. The grid lines are electrically connected to the gates of the thin-film transistors of at least one row of detection pixel units arranged in the second direction, and the data lines are electrically connected to the second electrodes of the thin-film transistors of at least one row of detection pixel units arranged in the first direction.

The detection pixel units may be strip-shaped, the first direction may be an OB direction shown in FIG. 1 (a long-side direction of the detection pixel units), and in this case, the second direction may be an OA direction shown in FIG. 1 (a short-side direction of the detection pixel units). Or, the first direction may be the OA direction shown in FIG. 1 (the short-side direction of the detection pixel units), and in this case, the second direction may be the OB direction shown in FIG. 1 (the long-side direction of the detection pixel units). The present disclosure has no limitation in this aspect. FIG. 1 is drawn with the OB direction as the first direction and the OA direction as the second direction.

"The grid lines are electrically connected to the gates of the thin-film transistors of at least one row of detection pixel units arranged in the second direction" means that the grid lines 7 are electrically connected to the gates of the thin-film transistors 12 of only one row (one column in FIG. 1) of detection pixel units 1 arranged in the second direction (the OA direction in FIG. 1), as show in FIG. 1 and FIG. 2, or that the grid lines are electrically connected to the gates of the thin-film transistors of multiple rows of detection pixel units arranged in the second direction. The present disclosure has no limitation in this aspect.

"The data lines are electrically connected to the second electrodes of the thin-film transistors of at least one row of detection pixel units arranged in the first direction" means that the data lines 6 are electrically connected to the second electrodes of the thin-film transistors 12 of only one row (one column in FIG. 1) of detection pixel units arranged in the first direction (the OB direction in FIG. 1), as shown in FIG. 1 and FIG. 2, or that the data lines are electrically connected to the second electrodes of the thin-film transistors of multiple rows of detection pixel units arranged in the first direction. The present disclosure has no limitation in this aspect.

The grid lines may be disposed on the same layer as the gates of the thin-film transistors, and the data lines may be disposed on the same layer as the first electrodes and the second electrodes of the thin-film transistors, so that the patterning processes are simplified, and the cost is reduced. A one-step patterning process is used to dispose the grid lines and the gates of the thin-film transistors on the same layer and dispose the data lines and the first electrodes and the second electrodes of the thin-film transistors on the same layer. The one-step patterning process is a process for forming a required layer structure by one-step film formation and lithography, and comprises film formation, exposure, development, etching and stripping.

In the detection base plate, the grid lines are able to provide a control signal for the gates of the thin-film transistors to control the thin-film transistors to be turned on or off; and the photoelectric conversion parts are able to convert visible light into an electric signal, which is then output by the thin-film transistors and is transmitted to a processing unit by means of the data lines, and the processing unit processes the electric signal to display an image.

Further optionally, as shown in FIG. 2, in the detection pixel unit, the sacrificial layer 10 comprises a first part 21 and a second part 22 that are connected, wherein a portion, close to the grid line 7 or the data line 6, of the first part 21 protrudes out of the second part 22. In FIG. 2, the first part and the second part are separated by a black dotted line to be clearly distinguished, but in fact, the black dotted line does not exist.

A line width W1 of a portion, close to the first part 21, of the data line 6 is smaller than a line width W2 of a portion, close to the second part 22, of the data line 6, and a line width W3 of a portion, close to the first part 21, of the grid line 7 is smaller than a line width W4 of a portion, close to the second part 22, of the grid line 7.

As shown in FIG. 2, an orthographic projection of the thin-film transistor on the substrate is located within an orthographic projection of the first part 21 of the sacrificial layer 10 on the substrate, and an orthographic projection of the second part 22 on the substrate does not overlap with the orthographic projection of the thin-film transistor on the substrate.

The portion, close to the grid line or the data line, of the first part of the sacrificial layer protrudes out of the second part, so that the coverage area of the sacrificial layer is expanded as large as possible under the precondition that the original design area is not enlarged to ensure that the orthographic projection of the thin-film transistor on the substrate is located within the orthographic projection of the first part on the substrate, and thus, the whole thin-film transistor is protected. Besides, the filling rate of the photoelectric conversion part is increased, and the detection accuracy is further improved.

The line widths have a direct influence on the resistance of the data lines and the grid lines, and thus will influence the data transmission rate. By adoption of the above line widths of the data lines and the grid lines, the influence on the line widths of the data lines and the grid lines is minimized to guarantee the data transmission rate; moreover, the original design area is used to the maximum extent and will not be enlarged, so that the detection accuracy of the detection base plate is guaranteed.

Further optionally, the detection pixel unit further comprises: a bias electrode electrically connected to the photoelectric conversion part. The detection base plate further comprises multiple bias lines arranged in the second direction, and the bias lines are electrically connected to the bias electrodes of at least one row of detection pixel units arranged in the first direction.

As shown in FIG. 3a and FIG. 3b, the detection pixel unit further comprises: a second organic layer 16, a second passivation layer 17 and a third passivation layer 19 that are sequentially stacked on the photoelectric conversion structure 15, wherein the bias electrode 18 is located between the second passivation layer 17 and the third passivation layer 19.

"The bias lines are electrically connected to the bias electrodes of at least one row of detection pixel units arranged in the first direction" means that the bias lines 5 are electrically connected to the bias electrodes of only one row (one column in FIG. 1) of detection pixel units arranged in the first direction (the OB direction in FIG. 1) as shown in FIG. 1, or that the bias lines are electrically connected to the bias electrodes of multiple rows of detection pixel units arranged in the first direction.

The bias lines may be disposed on the same layer as the data lines and the first electrodes and the second electrodes of the thin-film transistors to simplify the patterning processes and reduce costs.

In the detection base plate, a bias signal may be input to the bias electrodes by means of the bias lines, and then, a bias voltage is provided for the photoelectric conversion parts.

It should be noted that the detection base plate may further comprise a gate drive unit 3, a processing unit 4 and a bias drive unit 2, as shown in FIG. 1. The gate drive unit 3 is connected to the multiple grid lines 7 to provide a control signal for the grid lines. The processing unit 4 is connected to the multiple data lines 6 to acquire and process an electric signal output by the data lines. The bias drive unit 2 is connected to the multiple bias lines 5 to provide a bias signal for the bias lines. The present disclosure has no limitation to the specific structure of the gate drive unit, the processing unit and the bias drive unit. In FIG. 1, the detection base plate comprises three rows and four columns of detection pixel units, by way of example.

In addition, the detection base plate may further comprise an organic packaging layer and a scintillant layer that are sequentially disposed on the third passivation layer, wherein the scintillant layer is able to convert X-rays into visible light.

Optionally, the active layer is made of any one of indium gallium zinc oxide (IGZO), indium tin zinc oxide (ITZO), gallium indium tin oxide (GITO), and indium gallium zinc tin oxide (IGZTO). The thin-film transistors have a high carrier mobility, thus meeting the requirements of dynamic FPXDs.

The sacrificial layer is made of any one of indium zinc oxide (IZO), indium tin oxide (ITO), IGZO, ITZO and GITO, and is more likely to react with hydrogen atoms to consume more hydrogen atoms to further protect the thin-film transistor.

One embodiment of the present disclosure provides a flat-panel detector comprising the detection base plate. The flat-panel detector may be an FPXD, is applied to the medical field, the security field, the industrial detection field, and the like, and has the advantages of being stable in performance, high in reaction speed, and the like. Relevant structures of the detection base plate of the flat-panel detector can be understood with reference to the above embodiments, and will no longer be described here.

One embodiment of the present disclosure provides a manufacturing method of the detection base plate. Please refer to FIG. 3a-FIG. 3c for the structure of the detection base plate. The manufacturing method comprises:

S01: forming multiple detection pixel units on a substrate.

The present disclosure has no limitation to the material of the substrate. The substrate may be made of a rigid material such as glass, or a flexible material such as polyimide (PI).

The forming multiple detection pixel units on the substrate in S01 comprises:

S101: forming multiple thin-film transistors, wherein each thin-film transistor comprises an active layer, a first electrode and a second electrode, the first electrode and the second electrode are electrically connected to the active layer, and the active layer is made of a metal oxide.

The specific method for forming the multiple thin-film transistors is not limited here, and depends on the specific structure of the thin-film transistors.

S102: forming multiple mutually independent sacrificial layers, wherein in each detection pixel unit, at least part of an orthographic projection of the active layer on the substrate is located within an orthographic projection of the sacrificial layer on the substrate; the sacrificial layers are made of a metal oxide.

The sacrificial layers may be made of any one of indium zinc oxide (IZO), indium tin oxide (ITO), IGZO, ITZO and GITO.

S103: forming multiple mutually independent photoelectric conversion parts, wherein in the detection pixel units, the photoelectric conversion parts are electrically connected to the sacrificial layers and the first electrodes.

Figure 7:
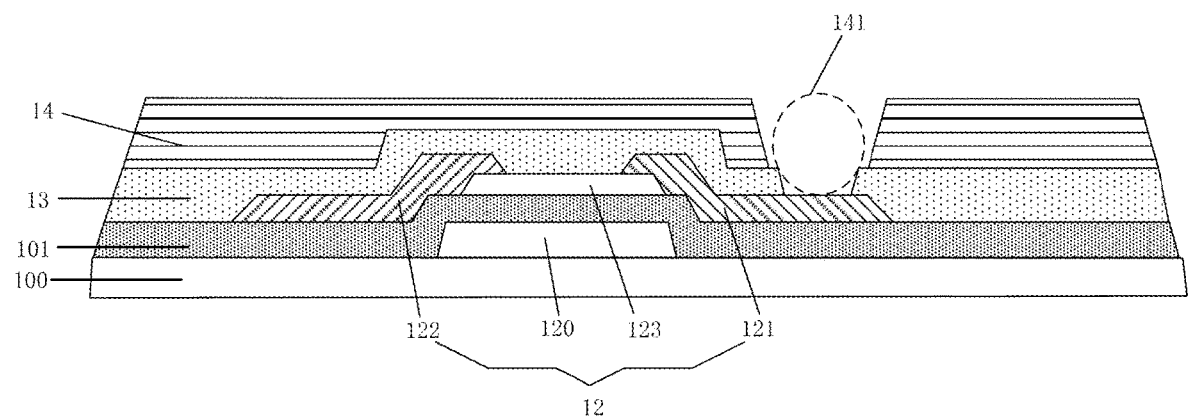
FIG. 7-FIG. 9 are sectional structural diagrams of the manufacturing process of a detection base plate according to one embodiment of the present disclosure.
Figure 8:
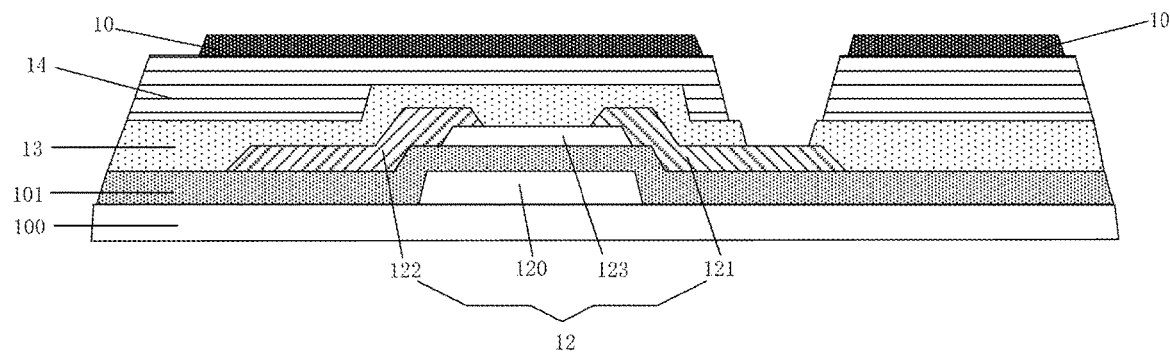

The manufacturing method of the detection base plate shown in FIG. 3a will be specifically described below by way of example. The method comprises:

S11: sequentially forming a grid metal layer, a grid insulating layer, an active layer, a source-drain metal layer, a first passivation layer and a first organic layer, that are stacked together, on a substrate;

S12: etching the first passivation layer and the first organic layer to form multiple first via holes 141 shown in FIG. 7 so as to form a detection base plate shown in FIG. 7, wherein the first via holes 141 penetrates through the first passivation layer 13 and a first organic layer 14 to expose the first electrodes 121, as shown in FIG. 7;

S13: depositing and patterning a metal oxide film to form multiple mutually independent sacrificial layers so as to form the detection base plate shown in FIG. 8, wherein orthographic projections of the sacrificial layers 10 on the substrate do not overlap with orthographic projections of the first via holes on the substrate.

In FIG. 8, an orthographic projection of the active layer 123 on the substrate is completely located within the orthographic projections of the sacrificial layers 10 on the substrate, that is, the sacrificial layers 10 cover the whole active layer 123. The metal oxide film may be made of ITO.

Figure 9:
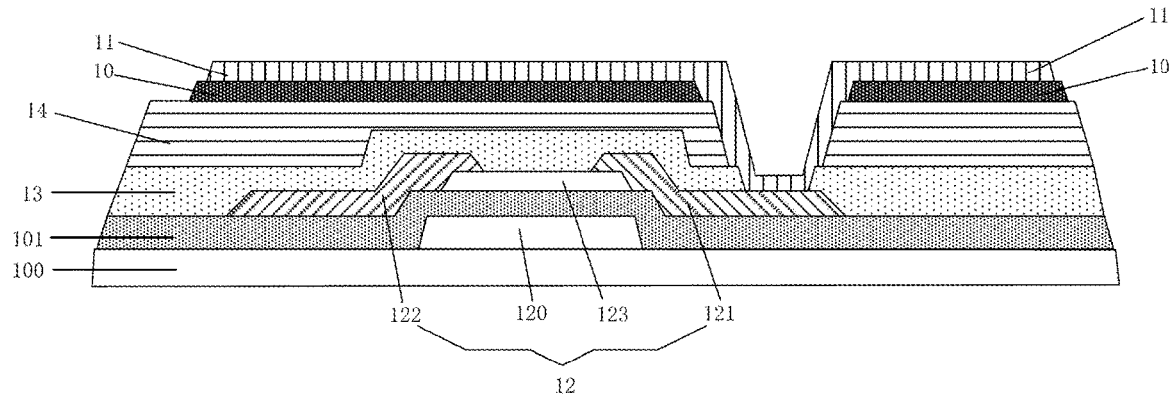

S14: forming multiple read electrodes 11 shown in FIG. 9.

As shown in FIG. 9, the read electrodes 11 cover the first via holes and directly contact with the first electrodes 121 by means of the first via holes to realize electrical connection. The read electrodes 11 are located on the sacrificial layers 10 and contact with the sacrificial layer 10. The read electrodes may be made of a metal or a metal alloy. To increase the read rate, the read electrodes may be made of a high-conductivity metal such as molybdenum, aluminum, silver, copper, titanium, platinum or tungsten.

S15: forming multiple photoelectric conversion structures 15 shown in FIG. 3a, wherein orthographic projections of the photoelectric conversion structures on the substrate do not overlap with the orthographic projections of the first via holes on the substrate.

Specifically, a first doping layer, an intrinsic layer and a second doping layer, that are stacked together, may be sequentially formed by Chemical Vapor Deposition (CVD). The first doping layer contact with the read electrodes.

S16: sequentially forming a second organic layer 16, a second passivation layer 17, a bias electrode 18 and a third passivation layer 19 stacked on the photoelectric conversion structures 15, as shown in FIG. 3a.

The bias electrode is electrically connected to a photoelectric conversion part by means of a second via hole, and the second via hole penetrates through the second organic layer and the second passivation layer.

The second passivation layer and the third passivation layer are able to fulfill a protection and insulation effect, and may be made of silicon nitride, silicon oxide, or silicon oxynitride. The second organic layer are able to fulfill an insulation and planarization effect, and may be made of an organic resin material such as polyacrylic resin, epoxy acrylate resin, polyester acrylate, or polyurethane acrylate resin.

The process in S15 and the process for manufacturing the second passivation layer and the third passivation layer in S16 are performed in a high-concentration hydrogen (H Plasma) atmosphere, in which the metal oxide thin-film transistors are prone to being influenced by water and oxygen, and particularly, hydrogen atoms will directly reduce the metal oxide active layer into metal elements, which in turn disable the switching characteristic of the metal oxide active layer. The sacrificial layers cover the active layer of all the thin-film transistors and are able to react with the hydrogen atoms to consume and block the hydrogen atoms to prevent the hydrogen atoms from diffusing to the thin-film transistors, so that the thin-film transistors are prevented, to the maximum extent, from being reduced, thus greatly improving the stability of the thin-film transistors, and accordingly, improving the performance of the flat-panel detector. In addition, the sacrificial layers in the detection pixel units contact with the read electrodes, so that no capacitance will be generated between the sacrificial layers and the read electrode. Besides, the sacrificial layers of the detection pixel units are mutually independent (that is, the sacrificial layers are of the pixel level), and will not be influenced by one another, so that the problem of signal interference is solved, and the product performance is further improved The aforesaid description is merely for explaining the specific implementations of the present disclosure, and is not intended to limit the protection scope of the present disclosure. All variations or substitutions easily obtained by any skilled in the art within the technical scope of the present disclosure should also fall within the protection scope of the present disclosure. Thus, the protection scope of the present disclosure should be subject to the protection scope of the claims.

The invention claimed is:

1. A detection base plate, comprising a substrate and multiple detection pixel units located on the substrate and arranged in an array;

each said detection pixel unit comprising: a thin-film transistor, a sacrificial layer and a photoelectric conversion layer disposed on the substrate; the sacrificial layer being located between the thin-film transistor and the photoelectric conversion part, wherein the sacrificial layer is an oxide material;

wherein the thin-film transistor comprises an active layer, a first electrode and a second electrode;

at least part of an orthographic projection of the active layer on the substrate is located within an orthographic projection of the sacrificial layer on the substrate;

the photoelectric conversion part is electrically connected to the sacrificial layer and the first electrode; and in the detection base plate, the sacrificial layers of the detection pixel units are mutually independent;

wherein the photoelectric conversion part is disposed on a side, away from the substrate, of the thin-film transistor;

the photoelectric conversion part comprises a read electrode;

in the detection pixel units, the sacrificial layers contact with the read electrode; and at least part of a boundary of an orthographic projection of the read electrode on the substrate is located within a boundary of the orthographic projection of the sacrificial layer on the substrate;

wherein the photoelectric conversion part further comprises a photoelectric conversion structure disposed on a side, away from the substrate, of the read electrode.

2. The detection base plate according to claim 1, wherein the read electrodes of the photoelectric conversion parts of the detection pixel units are mutually independent.

3. The detection base plate according to claim 1, wherein the detection pixel unit further comprises a first insulating layer and a first via hole, and the first via hole penetrates through the first insulating layer to expose the first electrode; and the sacrificial layer does not contact with the first electrode, and the read electrode contacts with the first electrode by means of the first via hole.

4. The detection base plate according to claim 3, wherein the orthographic projection of the sacrificial layer on the substrate does not overlap with or partially overlaps with an orthographic projection of the first via hole on the substrate.

5. The detection base plate according to claim 3, wherein the first insulating layer comprises a first passivation layer and a first organic layer, and the first passivation layer covers the thin-film transistor; and the first organic layer is located between the first passivation layer and the sacrificial layer.

6. The detection base plate according to claim 3, wherein an orthographic projection of the photoelectric conversion structure on the substrate does not overlap with the orthographic projection of the first via hole on the substrate.

7. The detection base plate according to claim 6, wherein a boundary of the orthographic projection of the photoelectric conversion structure on the substrate is located within a boundary of the orthographic projection of the read electrode on the substrate.

8. The detection base plate according to claim 1, wherein the detection pixel unit further comprises: a second insulating layer, a bias electrode and a third passivation layer that are sequentially stacked on the photoelectric conversion part;

wherein the bias electrode is electrically connected to the photoelectric conversion part by means of a second via hole, and the second via hole penetrates through the second insulating layer.

9. The detection base plate according to claim 8, wherein the second insulating layer comprises a second passivation layer and a second organic layer, and the detection pixel unit further comprises: an electrically conductive electrode located between the photoelectric conversion part and the second organic layer and contacting with the photoelectric conversion part.

10. The detection base plate according to claim 9, wherein the photoelectric conversion part comprises a read electrode and a photoelectric conversion structure;

the photoelectric conversion structure is disposed on a side, away from the substrate, of the read electrode, and comprises a first doping layer, an intrinsic layer and a second doping layer that are sequentially stacked on the read electrode, and a polarity of the first doping layer is opposite to a polarity of the second doping layer; and the first doping layer contacts with the read electrode, and the second doping layer contacts with the electrically conductive electrode.

11. The detection base plate according to claim 10, wherein an orthographic projection of the electrically conductive electrode on the substrate may be located within an orthographic projection of the photoelectric conversion part on the substrate.

12. The detection base plate according to claim 1, further comprising multiple grid lines arranged in a first direction and multiple data lines arranged in a second direction, wherein in the detection pixel units, the orthographic projections of the sacrificial layers on the substrate do not overlap with orthographic projections of the grid lines on the substrate and do not overlap with orthographic projections of the data lines on the substrate either.

13. The detection base plate according to claim 12, wherein in the detection pixel units, the sacrificial layers comprise first parts and second parts, and portions, close to the grid lines or the data lines, of the first parts protrude out of the second parts; and a line width of portions, close to the first parts, of the data lines is smaller than that of portions, close to the second parts, of the data lines, and a line width of portions, close to the first parts, of the grid lines is smaller than that of portions, close to the second parts, of the grid lines.

14. The detection base plate according to claim 13, wherein the detection pixel unit further comprises: a bias electrode electrically connected to the photoelectric conversion part; and the detection base plate further comprises multiple bias lines arranged in the second direction, and the bias lines are electrically connected to the bias electrodes of at least one row of detection pixel units arranged in the first direction.

15. The detection base plate according to claim 1, wherein when the thin-film transistor is an N-type thin-film transistor, the first electrode is a drain, and the second electrode is a source; or when the thin-film transistor is a P-type thin-film transistor, the first electrode is a source, and the second electrode is a drain.

16. A flat-panel detector, comprising the detection base plate according to claim 1.

17. A detection base plate, comprising a substrate and multiple detection pixel units located on the substrate and arranged in an array;
- each said detection pixel unit comprising: a thin-film transistor, a sacrificial layer and a photoelectric conversion layer disposed on the substrate; the sacrificial layer being located between the thin-film transistor and the photoelectric conversion part, wherein the sacrificial layer is an oxide material;
- wherein the thin-film transistor comprises an active layer, a first electrode and a second electrode;
- at least part of an orthographic projection of the active layer on the substrate is located within an orthographic projection of the sacrificial layer on the substrate;
- the photoelectric conversion part is electrically connected to the sacrificial layer and the first electrode; and
- in the detection base plate, the sacrificial layers of the detection pixel units are mutually independent;
- wherein in the detection pixel units, the sacrificial layers comprise first parts and second parts, and portions, close to the grid lines or the data lines, of the first parts protrude out of the second parts; and
- a line width of portions, close to the first parts, of the data lines is smaller than that of portions, close to the second parts, of the data lines, and a line width of portions, close to the first parts, of the grid lines is smaller than that of portions, close to the second parts, of the grid lines;
- wherein the photoelectric conversion part further comprises a photoelectric conversion structure disposed on a side, away from the substrate, of the read electrode.

18. A detection base plate, comprising a substrate and multiple detection pixel units located on the substrate and arranged in an array;
- each said detection pixel unit comprising: a thin-film transistor, a sacrificial layer and a photoelectric conversion layer disposed on the substrate; the sacrificial layer being located between the thin-film transistor and the photoelectric conversion part, wherein the sacrificial layer is capable of reacting with hydrogen atoms, and the sacrificial layer is made of any one of indium zinc oxide, indium tin oxide, indium gallium zinc oxide, indium tin zinc oxide, and gallium indium tin oxide;
- wherein the thin-film transistor comprises an active layer, a first electrode and a second electrode;
- at least part of an orthographic projection of the active layer on the substrate is located within an orthographic projection of the sacrificial layer on the substrate;
- the photoelectric conversion part is electrically connected to the sacrificial layer and the first electrode; and
- in the detection base plate, the sacrificial layers of the detection pixel units are mutually independent;
- wherein the photoelectric conversion part is disposed on a side, away from the substrate, of the thin-film transistor;
- the photoelectric conversion part comprises a read electrode;
- in the detection pixel units, the sacrificial layers contact with the read electrode; and
- at least part of a boundary of an orthographic projection of the read electrode on the substrate is located within a boundary of the orthographic projection of the sacrificial layer on the substrate;
- wherein the orthographic projection of the active layer on the substrate is located within the orthographic projection of the sacrificial layer on the substrate.

* * * * *